(12) United States Patent
Akiyama

(10) Patent No.: US 8,008,779 B2
(45) Date of Patent: Aug. 30, 2011

(54) SEMICONDUCTOR DEVICE AND SEMICONDUCTOR DEVICE MANUFACTURING METHOD

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 512 days.

(21) Appl. No.: 10/807,274

(22) Filed: Mar. 24, 2004

(65) Prior Publication Data

US 2005/0116333 A1 Jun. 2, 2005

(30) Foreign Application Priority Data

Mar. 27, 2003 (JP) .............................. P2003-088907

(51) Int. Cl.
*H01L 23/48* (2006.01)
(52) U.S. Cl. ......... 257/773; 257/758; 257/798; 257/776
(58) Field of Classification Search .................. None
See application file for complete search history.

(56) References Cited

U.S. PATENT DOCUMENTS

| | | | |
|---|---|---|---|
| 5,994,762 A * | 11/1999 | Suwanai et al. | 257/620 |
| 6,207,585 B1 | 3/2001 | Hasegawa et al. | |
| 6,313,037 B1 | 11/2001 | Kajita et al. | |
| 6,498,089 B2 | 12/2002 | Komada | |
| 6,770,977 B2 * | 8/2004 | Kishida et al. | 257/761 |

FOREIGN PATENT DOCUMENTS

| | | | |
|---|---|---|---|
| JP | 5-152433 A | | 6/1993 |
| JP | 06-097165 | | 4/1994 |
| JP | 06-188240 A | | 7/1994 |
| JP | 10-189497 | | 7/1998 |
| JP | 10-189733 A | | 7/1998 |
| JP | 10-209148 | | 8/1998 |
| JP | 11-054504 | | 2/1999 |
| JP | 2000-277465 | | 10/2000 |
| JP | 2001-196415 A | | 7/2001 |
| JP | 2002-270608 | | 9/2002 |
| JP | 2002-353307 A | | 10/2002 |

OTHER PUBLICATIONS

Wolf et al., Silicon Processing for the VLSI Era, 2000, vol. I, Lattice Press, 719-727, 791-795.*
Notification of the First Office Action from the Patent Office of the People's Republic of China, mailed Dec. 9, 2005.
Office Action from the Japanese Patent Office, mailed Oct. 24, 2006.
Notification of Reasons for Rejection from the Japanese Patent Office, dated Mar. 10, 2009 (3 pages).

* cited by examiner

*Primary Examiner* — Leonardo Andujar
(74) *Attorney, Agent, or Firm* — Finnegan, Henderson, Farabow, Garrett & Dunner, L.L.P.

(57) ABSTRACT

Disclosed is a semiconductor device that includes: a semiconductor substrate; a first insulating film formed above the semiconductor substrate and having a relative dielectric constant of 3.8 or less; a conductor which covers a side face of the first insulating film at least near four corners of the semiconductor substrate, and at least an outer side face of which has a conductive barrier layer; and a second insulating film covering the outer side face of the conductor and having a relative dielectric constant of over 3.8. Also disclosed is a semiconductor device that includes: a conductor covering a side face of the first insulating film at least near four corners of the semiconductor substrate; and a corrosion resistant conductor formed at least near the four corners of the semiconductor substrate to extend from directly under the second insulating film to directly under the conductor.

7 Claims, 12 Drawing Sheets

SEMICONDUCTOR DEVICE AND SEMICONDUCTOR DEVICE MANUFACTURING METHOD

CROSS REFERENCE TO THE INVENTION

This application is based upon and claims the benefit of priority from the prior Japanese Patent Application No. 2003-88907, filed on Mar. 27, 2003; the entire contents of which are incorporated herein by reference.

BACKGROUND

1. Field of the Invention

The present invention relates to a semiconductor device and a manufacturing method thereof, and more particularly, to a semiconductor device having an insulating film whose relative dielectric constant is 3.8 or lower and to a manufacturing method thereof.

2. Description of the Related Art

As a structure of a semiconductor device (semiconductor chip) having multi-interlayer insulating films in which a side face of the interlayer insulating film in the peripheral edge of the semiconductor chip is sealed for improving reliability, that disclosed in the following patent document 1 is an example. In this example, conductors made of the same material as that of wirings or the like are used as seal members.

[Patent Document 1]

Japanese Patent Laid-open No. 2000-277465

For the purpose of further improving the operating speed of a semiconductor device, decrease in wiring resistance, reduction in dielectric constant of an interlayer insulating film with an aim of reducing electrostatic capacitance of a wiring, and so on have been promoted in recent years. Specifically, copper (Cu) is replacing aluminum (Al) as the material of the wiring. As the interlayer insulating film, the adoption of a low dielectric constant insulating film (low-k film) such as a $SiO_2$ film doped with fluorine and a $SiO_2$ film containing an organic component is being promoted in place of the adoption of a simple $SiO_2$ film. Incidentally, an interlayer insulating film whose dielectric constant (capacitance coefficient) k is 3 or less is coming into use in recent years instead of a conventional interlayer insulating film whose dielectric constant k is 4.2.

In a dicing process for cutting out semiconductor chips, caution is required so that mechanical stress of the process does not deteriorate reliability as semiconductor chips. This is important especially in the current circumstances where the adoption of the low dielectric constant insulating film as described above is being promoted as the interlayer insulating film. The low dielectric constant insulating film is obtained by, for example, reduction in material density, exclusion of a dielectric polarization property in the material, or the like. The reduction in material density is achieved by, for example, making the material porous, but such a low dielectric constant insulating film is low in mechanical physical value such as Young's modulus.

Some low dielectric constant insulating film adopts a film structure low in polarity in order to lower a relative dielectric constant in the film. This structure decreases adhesion strength on interfaces of layered films in which low-k films are layered or a low-k film and a different film are layered.

The low mechanical strength of the low dielectric constant insulating film itself and the low adhesion strength on the interfaces of the layered films including the low dielectric constant insulating film may possibly be factors of causing problems in the dicing process, resulting in reliability deterioration as a semiconductor device. Specifically, mechanical stress in the dicing process tends to cause minute peeling and breakage (cracks and burrs) of the interlayer insulating film. When the minute peeling and so on occur in cut surfaces of the interlayer insulating film, the film peeling is made larger in a subsequent assembly process, so that the problem becomes conspicuous.

Under such circumstances, for the purpose of solving the problem in the dicing process, a semiconductor wafer having a trench structure in a dicing part as shown in, for example, the aforesaid patent document 1 is adoptable. It can be thought that this structure also has an effect of enhancing reliability since the sealing of side faces of the interlayer insulating films with the conductors prevents permeation of water and so on into the interlayer insulating films. However, it should be noted that the deterioration of the sealing conductors themselves due to corrosion and so on affects reliability. This is because the deterioration may possibly impair effectiveness as the seal members.

SUMMARY

A semiconductor device according to one aspect of the present invention includes: a semiconductor substrate; a first insulating film formed above the semiconductor substrate and having a relative dielectric constant of 3.8 or less; a conductor which covers a side face of the first insulating film at least near four corners of the semiconductor substrate, and at least an outer side face of which has a conductive barrier layer; and a second insulating film covering the outer side face of the conductor and having a relative dielectric constant of over 3.8.

A semiconductor device according to another aspect of the present invention includes: a semiconductor substrate; a first insulating film formed above the semiconductor substrate and having a relative dielectric constant of 3.8 or less; a conductor covering a side face of the first insulating film at least near four corners of the semiconductor substrate; a second insulating film covering an outer side face of the conductor and having a relative dielectric constant of over 3.8; and a corrosion resistant conductor formed to extend from directly under the second insulating film to directly under the conductor at least near four corners of the semiconductor substrate.

A semiconductor device manufacturing method according to one aspect of the present invention includes: forming a first insulating film with a relative dielectric constant of 3.8 or less above a semiconductor wafer; forming trenches at least near an intersecting point of dicing lines on the semiconductor wafer, the trenches facing each other across the dicing line and passing through the first insulating film; forming a conductor layer in each of the trenches via a conductive barrier layer to fill the trench with the conductor layer; removing the first insulating film at least near the intersecting point of the dicing lines sandwiched by the trenches each filled with the conductor layer; forming a second insulating film having a relative dielectric constant of over 3.8 so as to cover the conductive barrier layer that is exposed by the removal of the first insulating film; and dicing the semiconductor wafer after forming the second insulating film.

A semiconductor device manufacturing method according to another aspect of the present invention includes; forming a corrosion resistant conductor layer above a semiconductor wafer at least near an intersecting point of dicing lines on the semiconductor wafer to embrace the dicing lines; forming a first insulating film having a relative dielectric constant of 3.8 or less above the semiconductor wafer above which the corrosion resistant conductor layer is formed; forming a trench passing through the first insulating film at least near the intersecting point of the dicing lines on the semiconductor wafer to embrace the dicing lines; forming a conductor layer in the trench to fill the trench with the conductor layer; forming a second trench embracing the dicing lines at least near the intersecting point of the dicing lines on the semiconductor wafer, the second trench passing through the conductor layer to reach the corrosion resistant conductor layer; forming a second insulating film having a relative dielectric constant of over 3.8 so as to cover the conductive layer and the corrosion resistance conductive layer that are exposed in the second trench; and dicing the semiconductor wafer after forming the second insulating film.

DETAILED DESCRIPTION

Explanation of Embodiments

Figure 1A:
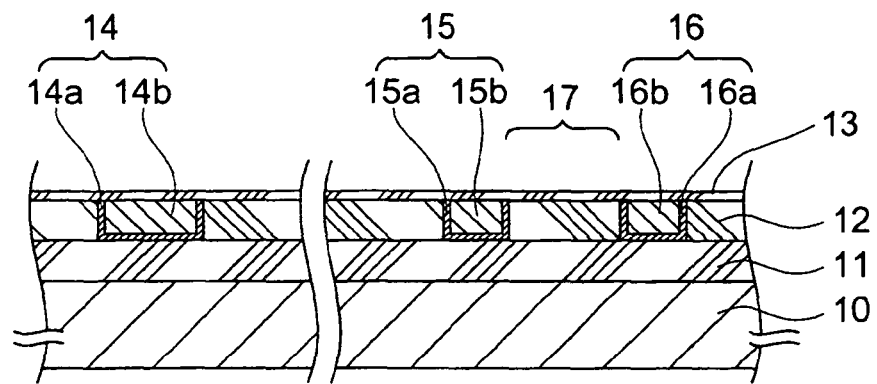
FIG. 1A and FIG. 1B are schematic cross-sectional views showing processes of a manufacturing method of a semiconductor device according to an embodiment of the present invention.

In a semiconductor device according to one aspect of the present invention, an insulating film having a relatively low relative dielectric constant of 3.8 or less is formed above a semiconductor substrate. Further, a conductor covering a side face of this low dielectric constant insulating film exists at least near four corners of the semiconductor substrate, and further, a second insulating film covering an outer side face of the conductor and having a relative dielectric constant of over 3.8 exists. The conductor has a conductive barrier layer at least on a second insulating film side thereof.

Therefore, the side face of the first insulating film is sealed by the conductor at least near the four corners of the semiconductor substrate, so that an effect of preventing water permeation into the first insulating film is exhibited. This effect is further enhanced since the conductor is covered with the second insulating film. Moreover, the conductor has corrosion resistance since it has the conductive barrier layer on at least the outer side face thereof, so that the deterioration of the conductor itself is greatly inhibited.

Incidentally, as the low dielectric constant insulating film having a relative dielectric constant of 3.8 or less, available are a $SiO_2$ film doped with fluorine (SiOF film: k=3.4 to 3.7), an organic silica film (k=2.5 to 3.0), a MSQ film (methyl silsesquioxane film: k=2.7 to 3.0, and in a porous state, k=2.0 to 2.5), a HSQ film (hydrogen silsesquioxane film: k=3.5 to 3.8, and in a porous state, k≈2.2), a PAE film (polyarylether film: k=2.7 to 2.9, and in a porous state, k=2.0 to 2.2), a PTFE film (polytetrafluoroethylene film: k=2.1), and so on. Incidentally, a Young's modulus of, for example, the $SiO_2$ film doped with fluorine is about 40 GPa, which is a relatively small value.

Here, in a semiconductor device as one form, the conductive barrier layer that the conductor has contains one kind selected from a group consisting of titanium (Ti), tantalum (Ta), zirconium (Zr), and tungsten (W), and the conductor contains as a major component one kind selected from a group consisting of copper (Cu), aluminum (Al), and tin (Sn).

In a semiconductor device according to another aspect of the present invention, a low dielectric constant insulating film, namely, an insulating film having a relative dielectric constant of 3.8 or less is formed above a semiconductor substrate. Further, a conductor covering this low dielectric constant insulating film exists on a side face of the insulating film at least near four corners of the semiconductor substrate, and a second insulating film having a relative dielectric constant of over 3.8 exists, covering an outer side face of this conductor. A corrosion resistant conductor is further formed at least near the four corners of the semiconductor substrate, extending from directly under the second insulating film to directly under the conductor.

Therefore, the side face of the first insulating film is sealed by the conductor at least near the four corners of the semiconductor substrate, so that an effect of preventing water permeation into the first insulating film is exhibited. This effect is further enhanced since the conductor is covered with the second insulating film. Moreover, the corrosion resistant conductor is formed at least near the four corners of the semiconductor substrate, extending from directly under the second insulating film to directly under the conductor, so that the corrosion resistance thereof accordingly enhances a sealability maintaining effect. Therefore, water permeation into the insulating film is effectively prevented, so that a semiconductor device suitable for improving reliability is provided.

Here, as one form, the conductor has one kind selected from a group consisting of copper (Cu), aluminum (Al), and tin (Sn).

As another form, the corrosion resistant conductor may be formed on an entire peripheral edge of the semiconductor substrate.

As still another form, the corrosion resistant conductor is tungsten (W). Tungsten (W) is a typical corrosion resistant conductor.

Further, in the semiconductor devices according to the aspect and the other aspect described above, the following forms may be adopted in common.

Specifically, in a semiconductor device as one form, the second insulating film may also cover an upper side of the first insulating film and the semiconductor device may further include a conductor pattern passing through the second insulating film positioned on the upper side of the first insulating film. The conductor pattern passes through the second insulating film positioned on the upper side of the first insulating film to form, for example, a pad wiring.

As another form, a conductive pattern buried in the first insulating film may be further provided. The conductive pattern can serve as, for example, a wiring. Further, when formed in a ring shape on the semiconductor substrate on an inner side of the conductor, this conductive pattern can be a guard ring. With this structure, water permeation into the first insulating film is further prevented, resulting in improved reliability.

As still another form, the first insulating film may be constituted of a plurality of layers. This structure realizes, for example, multilayered wirings.

As yet another form, the conductor may be formed in a ring shape covering an entire side face of the first insulating film. The ring-shaped formation realizes further improved reliability.

As yet another form, the second insulating film may be at least one kind selected from a group consisting of silicon oxide ($SiO_2$), silicon nitride (SiN), silicon carbide (SiC), and silicon carbonitride (SiCN). Such an insulating film is typical as an insulating film having a relative dielectric constant of over 3.8.

In a semiconductor device manufacturing method according to one aspect of the present invention, the semiconductor device according to the aforesaid aspect can be manufactured. Therefore, water permeation into the insulating film is effectively prevented, so that a semiconductor device manufacturing method suitable for effectively improving reliability can be provided.

In a semiconductor device manufacturing method according to the other aspect of the present invention, the semiconductor device according to the aforesaid other aspect can be manufactured. Therefore, water permeation into the insulating film is similarly prevented, so that a semiconductor device manufacturing method suitable for improving reliability can be provided.

As one form of these manufacturing methods, the forming of the first insulating film, the forming of the trench or the trenches passing through the first insulating film, and the filling of the trench may be repeated a plurality of times. This repletion enables the formation of multilayered wirings.

Based on the foregoing, embodiments of the present invention will be described below with reference to the drawings. FIG. 1A to FIG. 3B are schematic cross-sectional views showing processes of a manufacturing method of a semiconductor device according to one embodiment of the present invention. These drawings are sequential views in the order of the drawing number, and in each of FIG. 1A to FIG. 3B, the process proceeds in the order of A to B.

First, the structure shown in FIG. 1A is formed. An insulating film 11 having a relative dielectric constant of over 3.8 is formed on a semiconductor substrate 10 in a wafer state, and an insulating film (low-k film) 12 having a film thickness of 0.5 µm and having a relative dielectric constant of, for example, 2.5 is further formed on the entire insulating film 11. Note that elements such as transistors, though not shown, are formed in predetermined areas on the semiconductor substrate 10. Further, the insulating film 11 having a relative dielectric constant of over 3.8 has conductors in a vertical direction that are formed by a generally known method at necessary positions for realizing contact with the elements.

Next, a resist (not shown) is patterned by a lithography method, and a RIE (reactive ion etching) method is applied to the insulating film 12, thereby forming trenches for forming wirings (conductor patterns) 14 and trenches for forming conductors 15, 16 near dicing parts 17 as shown in the drawing. Then, conductive barrier layers (for example, TaN or Ta) 14a, 15a, 16a are formed on the entire surface including sidewalls and bottom faces of the formed trenches, and Cu layers are further formed thereon, both of the conductive barrier layers and the Cu layers being formed by, for example, a PVD (physical vapor deposition) method.

Incidentally, the trenches for forming the conductors 15, 16 are trenches facing each other across the line-shape dicing parts 17 that are set so as to embrace dicing lines. These trenches pass through the insulating film 12 and are provided at least near four corners of each semiconductor chip that is to be finished. The dicing parts 17 extend in a direction perpendicular to the drawing in FIG. 1A.

Next, a copper film is grown by electrolytic plating using the aforesaid films formed by the PVD as seeds, thereby filling the formed trenches described above with copper. Further, the copper film grown on the insulating film 12 and the conductive barrier layers 14a, 15a, 16a on the insulating film 12 are removed by a CMP (chemical mechanical polishing) method, and the wirings 14 each constituted of the conductive barrier layer 14a and an internal conductor (copper) 14b, and the conductors 15, 16 constituted of the conductive barrier layers 15a, 16a and internal conductors (copper) 15b, 16b are formed as shown in the drawing. The conductors 15, 16 have a three-layered structure in which copper is sandwiched by barrier materials along a substrate surface direction as shown in the drawing.

Subsequently, a top barrier film 13 formed of, for example, SiCN is formed on the entire surface to have a thickness of, for example, 50 nm. The top barrier film 13 is an insulating film and is removed at positions requiring connection to wirings and so on positioned above when an upper insulating film is perforated to form via holes.

Figure 1B:
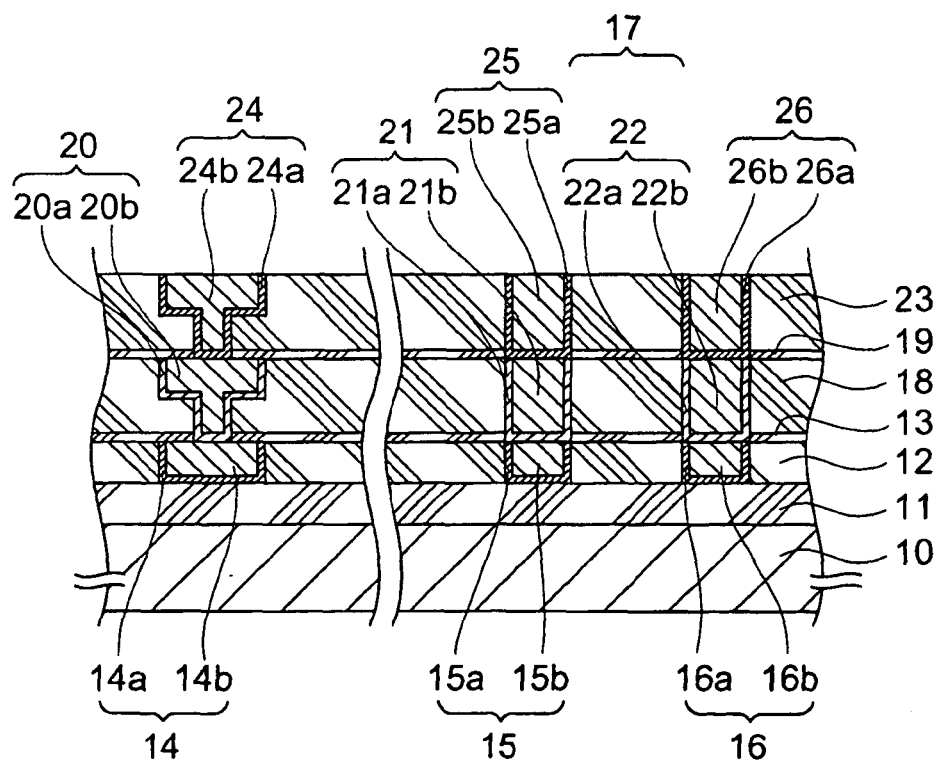

Next, the structure shown in FIG. 1B is formed. First, subsequently from the state shown in FIG. 1A, an insulating film (low-k film) 18 having a film thickness of 1 µm and having a relative dielectric constant of, for example, 2.5 is formed on the entire surface. As the insulating film 18, the same material as that of the insulating film 12 is usable. Then, via holes (for example, 0.3 µm in diameter) for forming vias as part of wirings 20, and trenches for forming conductors 21, 22 near the dicing parts 17 as shown in the drawing are formed by patterning a resist (not shown), using a lithography method and by applying a RIE method to the insulating film 18 and the top barrier film 13.

Further, trenches for forming the wirings (conductor patterns) 20 are formed to be 0.5 µm in depth that is about half the thickness of the insulating film 18, similarly by patterning through the use of the lithography method and by the application of the RIE method. The wirings 20 include vias (conductive connectors) for connection to a lower layer at necessary positions as shown in the drawing.

Conductive barrier layers (made of, for example, TaN, or Ta) 20a, 21a, 22a are formed on the entire surface including sidewalls and bottom faces of the formed trenches and via holes, and Cu layers are further formed thereon, both of the conductive barrier layers and the Cu layers being formed by, for example, a PVD method. Note that the positions of the trenches for forming the conductors 21, 22 are set so as to overlap the conductors 15, 16 positioned thereunder. These trenches pass through the insulating film 18 and the top barrier film 13.

Next, a copper film is grown by electrolytic plating, using the aforementioned films formed by the PVD as seeds, thereby filling the aforementioned trenches with copper. Further, the copper film grown on the insulating film 18 and the conductive barrier layers 20a, 21a, 22a on the insulating film 18 are removed by a CMP method, and the wirings 20 each constituted of the conductive barrier layer 20a and an internal conductor (copper) 20b, and the conductors 21, 22 constituted of the conductive barrier layers 21a, 22a and internal conductors (copper) 21b, 22b are formed as shown in the drawing. Subsequently, a top barrier film 19 formed of, for example, SiCN is formed on the entire surface to have a film thickness of 50 nm. The top barrier film 19 is an insulating film and is removed at positions requiring connection to wirings and so on positioned above when an upper insulating film is perforated to form via holes.

Explanations on wirings (conductor patterns) 24 each constituted of a conductive barrier layer 24a and an internal conductor (copper) 24b, conductors 25, 26 constituted of conductive barrier layers 25a, 26a and internal conductors (copper) 25b, 26b, an insulating film 23, and the top barrier film 19 are the same as the explanations in FIG. 1B on the wirings 20 each constituted of the conductive barrier layer 20a and the internal conductor (copper) 20b, the conductors 21, 22 constituted of the conductive barrier layers 21a, 22a and the internal conductors (copper) 21b, 22b, the insulating film 18, and the top barrier film 13, respectively. Incidentally, three layers of the low-k insulating films (the insulating films 12, 18, 23) having the wirings as described above are formed in this example, but they may be further multilayered in a similar manner (for example, totally 6 layers to 11 layers).

Figure 2A:
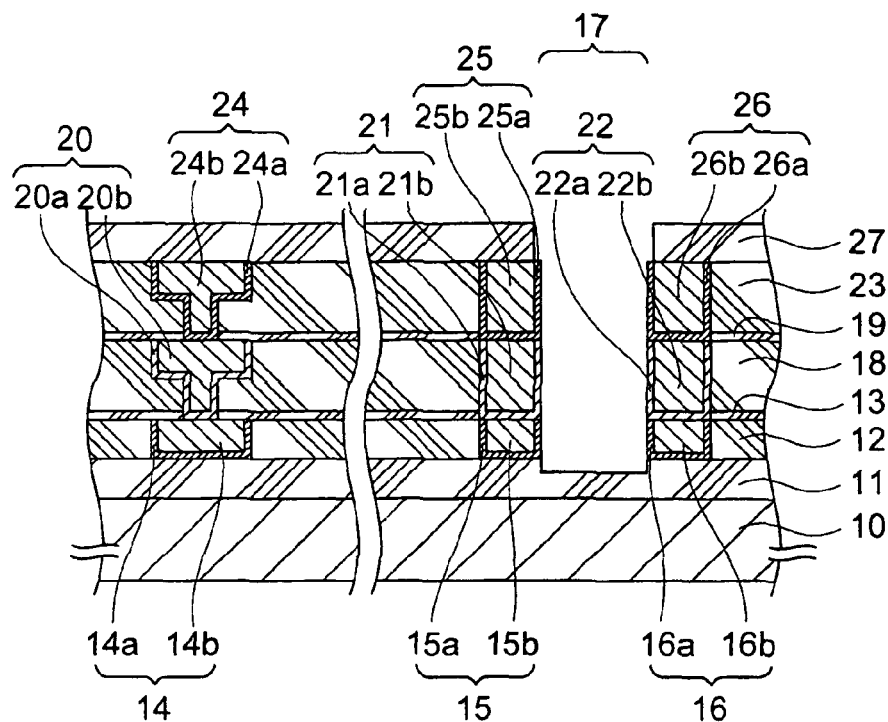
FIG. 2A and FIG. 2B, which are views subsequent to FIG. 1B, are schematic cross-sectional views showing processes of the manufacturing method of the semiconductor device according to the embodiment of the present invention.
Figure 2B:
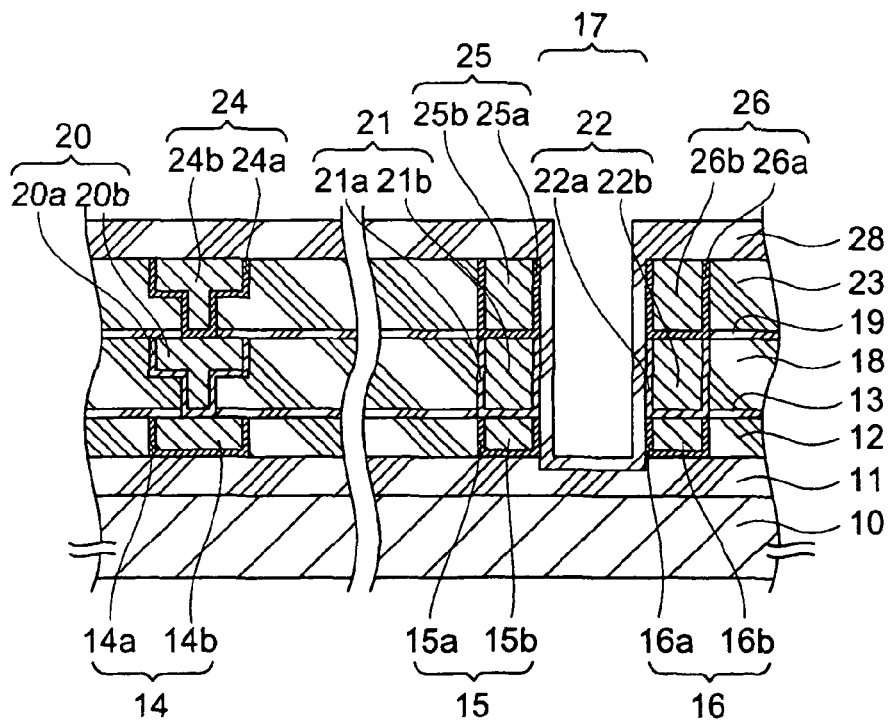

Next, the dicing parts 17 are processed to form trenches in the dicing parts 17 as shown in FIG. 2A and FIG. 2B. Specifically, a photoresist 27 formed on the insulating film 23 is first patterned by a photolithography method so as to have openings only at positions above the dicing parts 17. Then, the insulating films 23, 18, 12 and so on are removed by etching, using, for example, a wet solution that can remove the insulating films 23, 18, 12 without removing the barrier materials and copper. For example, hydrofluoric acid (HF) is usable as the wet solution. Though the insulating film 11 positioned under the low-k insulating film 12 is sometimes slightly removed by this etching, but this does not cause any significant problem.

Incidentally, in this etching, dry etching such as a RIE method and the abovementioned wet etching may be selectively used depending on the total thickness of the insulating films 23, 18, 12 and so on. Specifically, when the thickness is relatively small, the use of the dry etching does not have much influence on productivity. In the dry etching, high selection ratio conditions to the conductors 25, 26 and so on are used.

Figure 3A:
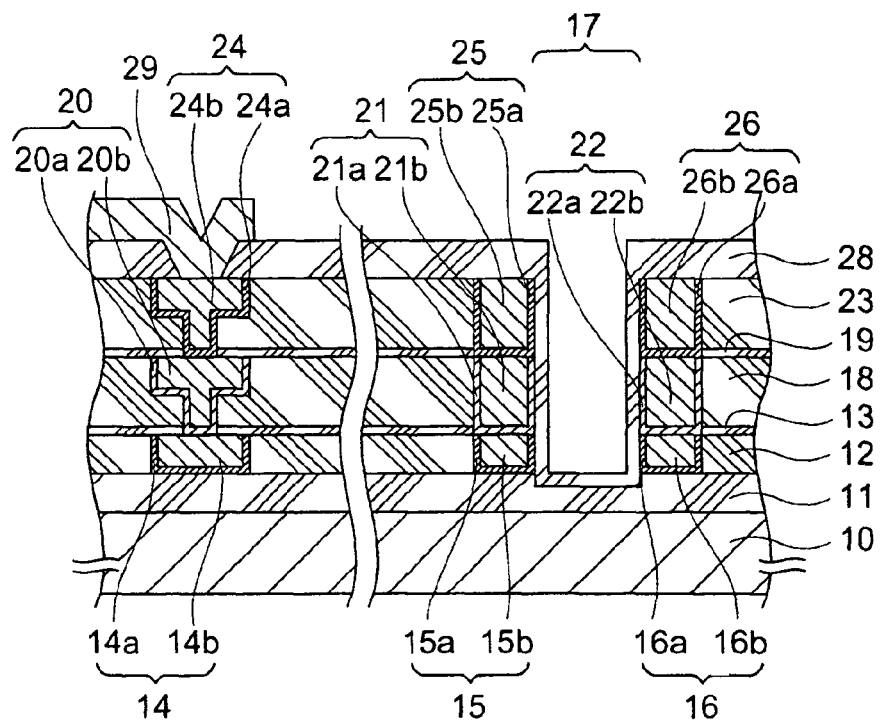
FIG. 3A and FIG. 3B, which are views subsequent to FIG. 2B, are schematic cross-sectional views showing processes of the manufacturing method of the semiconductor device according to the embodiment of the present invention.

After the etching is finished, an insulating film 28 made of, for example, TEOS (tetraethyl orthosilicate glass) and having a relative dielectric constant of 4.2 is formed on the entire surface including the sidewalls and bottom faces of the trenches in the dicing parts 17, as shown in FIG. 2B. Further, as shown in FIG. 3A, the insulating film 28 is partly perforated to allow, for example, pads 29 (conductor patterns) made of, for example, aluminum and the wirings 24 to be connected to each other. Finally, a passivation film 30 having a relative dielectric constant of, for example, 4.7 and made of SiN is formed on the entire surface except portions of the pads 29 connected to an external part. The passivation film 30 is deposited also on the sidewalls and bottom faces of the trenches in the dicing parts 17.

Figure 3B:
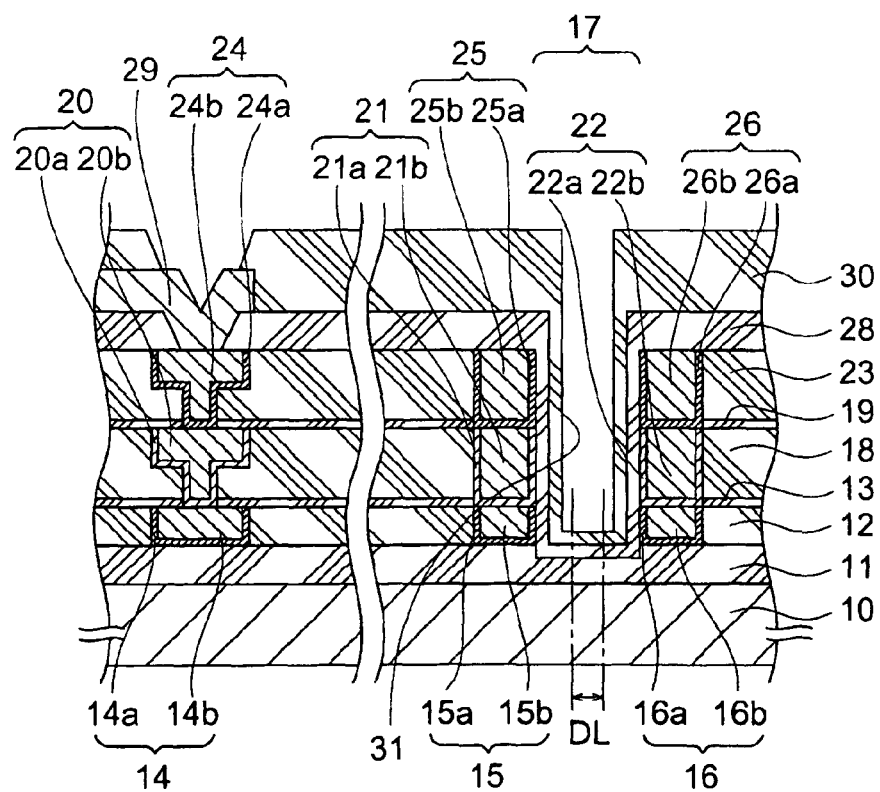

As shown in FIG. 3B, the semiconductor wafer manufactured in the above-described manner has trenches 31 formed in the dicing parts 17 and dicing lines DL existing inside the trenches 31. For assembly as a semiconductor device, this semiconductor wafer is cut along the dicing lines DL, cut pieces are separated as semiconductor chips, and the separated semiconductor chips are packaged after being electrically connected to an external part by, for example, bonding wires.

In this embodiment, the trenches 31 are formed in the dicing parts 17 in advance, and walls constituted of the conductors 25, 26 and so on are formed on both sides of each of the dicing parts 17 at least four corners of each chip. This makes it possible to prevent cracks which are likely to occur in the insulating films 12, 18, 23 with k=3.8 or lower when the semiconductor wafer is diced. Especially, the walls constituted of the conductors 25, 26 and so on that are harder than the insulating films 12, 18, 23 can prevent cracks from progressing and reaching the multilayered wirings 24, 20, 14 even when the cracks occur in the passivation film 30.

Moreover, when cracks or the like occur in the passivation film 30, the walls constituted of the conductors 25, 26 and so on can also prevent water permeation into the semiconductor chip through the cracks. In addition, outer side faces of the conductors 25, 26 and so on are corrosion resistant since they are made of the conductive barrier layers 25a, 26a, and so on. The conductive barrier layers 25a, 26a are made of, for example, high melting-point metal such as Ta, or TaN containing the high melting-point metal Ta, as previously described. These conductive substances do not easily corrode compared with low melting-point metal such as Cu and Al often used as a main material of a wiring.

Therefore, the time taken for the conductors 25, 26 and so on to lose the sealing function due to corrosion is greatly made longer. Consequently, water permeation into the insulating films 12, 18, 23 is effectively prevented, so that a semiconductor device suitable for improving reliability is provided. This effect is made more prominent when the walls constituted of the conductors 25, 26 and so on are formed in a ring shape on the semiconductor substrate 10 as will be described later. Incidentally, water permeation into the semiconductor chip causes corrosion of the wirings 14, 20, 24 and so on, which tends to lead to an open circuit fault and a short-circuit fault. Further, the external appearance as a semiconductor chip is affected.

The improvement in corrosion resistance in this embodiment results from the fact that the formation of the trenches 31 for dicing does not require the removal of the conductors 25, 26 and so on by etching. Specifically, if the conductors 25, 26 and so on are removed by etching in order to form the trenches 31, the sidewalls of the trenches formed by the etching would become easily corrosive surfaces since no conductor barrier layer exists thereon. Moreover, if post-treatment of the etching is not sufficient, for example, gas used in the RIE remains in and adheres to the trenches as byproduct substance generated in the etching process. For example, when exposed surfaces of the conductors 25, 26 and so on are copper, even a small amount of water permeation through cracks of the passivation film 30 would possibly cause corrosion due to its reaction with the residues.

Further, in this embodiment, the semiconductor substrate, in the state of a wafer before being cut into the semiconductor chips, has the trenches 31 that are formed in advance to embrace the dicing lines DL. This facilitates the dicing process. Moreover, in the state of cut-out chips, the insulating films (low-k films) 12, 18, 23 as the first insulating film are covered with the conductors 15, 21, 25 (16, 22, 26), and further covered with the insulating film 28 and passivation film 30 as the second insulating film, at least near four corners of each of the semiconductor chips. Consequently, the low dielectric constant insulating films 12, 18, 23 are protected.

Further, the insulating films 12, 18, 23 are objects of etching for forming the trenches 31 for dicing, productivity is higher than that of metal etching. This will be greatly advantageous when more insulating films having wirings are layered to form a multilayered structure of, for example, 6 layers to 10 layers with a thickness of 10 μm. In addition, the insulating films 23, 18, 12 sandwiched by the conductors 25, 26 and so on can be easily wet-etched instead of being dry-etched owing to difference in material from the conductors 25, 26, which also contributes to further improvement in productivity. This advantage is brought about by the structure that enables the control over side etching in a substrate surface direction through the utilization of selection ratio in the etching process.

Figure 4:
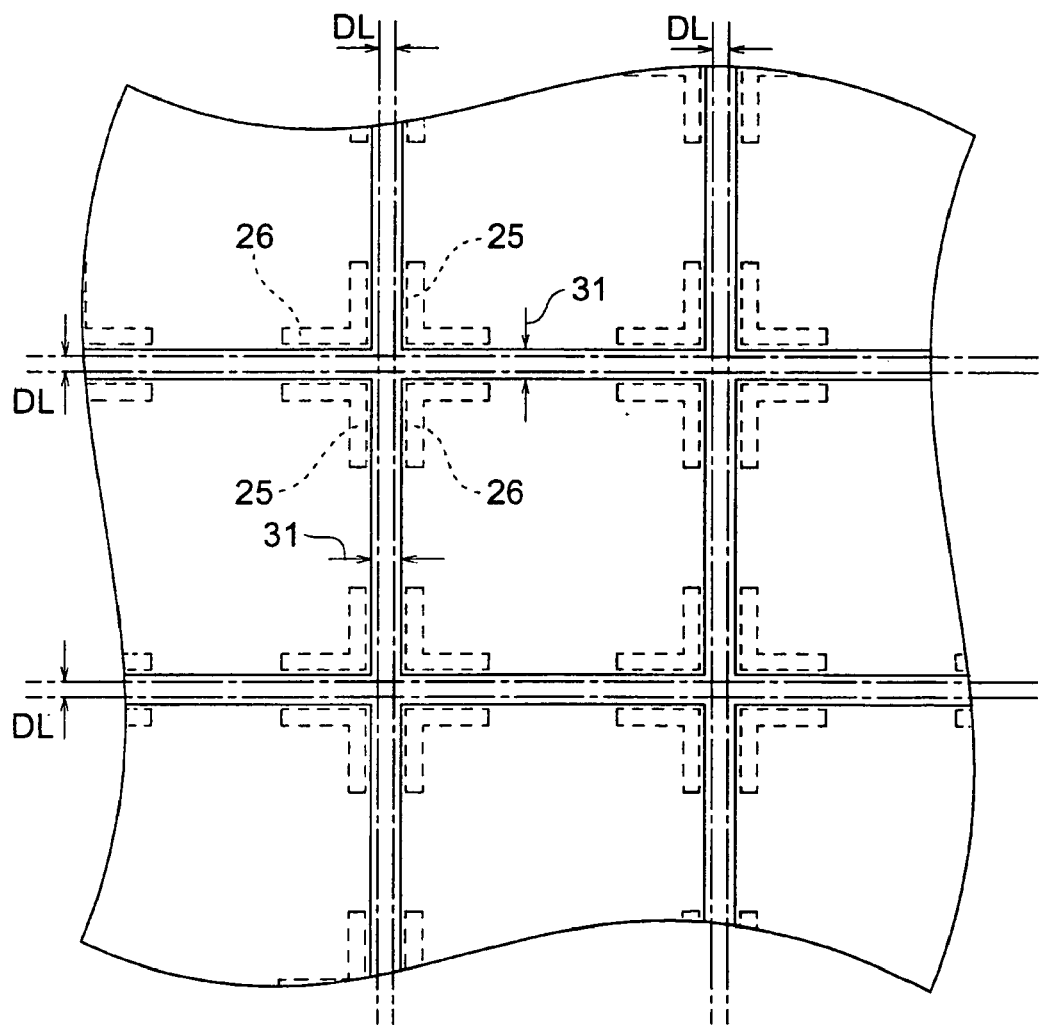
FIG. 4 is a schematic top view (one example) of a semiconductor wafer formed by the processes shown in FIG. 1A to FIG. 3B.

FIG. 4 is a schematic top view (an example) of the semiconductor wafer that is formed in the above-described manner. In FIG. 4, the same reference numerals and symbols are used to designate portions that are the same as or corresponding to the portions previously explained.

As is shown again in FIG. 4, the dicing lines DL exist in the trenches 31, and the conductors 25, 26 and so on having the three-layered structure in the substrate surface horizontal direction exist near the intersecting points of the dicing lines DL along the four corners of a semiconductor chip. The reason why the conductors 25, 26 and so on are provided only along portions near the four corners of each semiconductor chip is that strong stress is given especially to these portions due to structural characteristics when a packaging process is conducted and when the package is used as a product. In other words, the reason is that these portions are especially important in view of preventing reliability deterioration caused by stress generation. Alternatively, in such a case, for example, where the number of insulating layers is not very large and thus the dicing is not very difficult, the trenches 31 may also be provided appropriately only near the intersecting points of the dicing lines DL.

Figure 5:
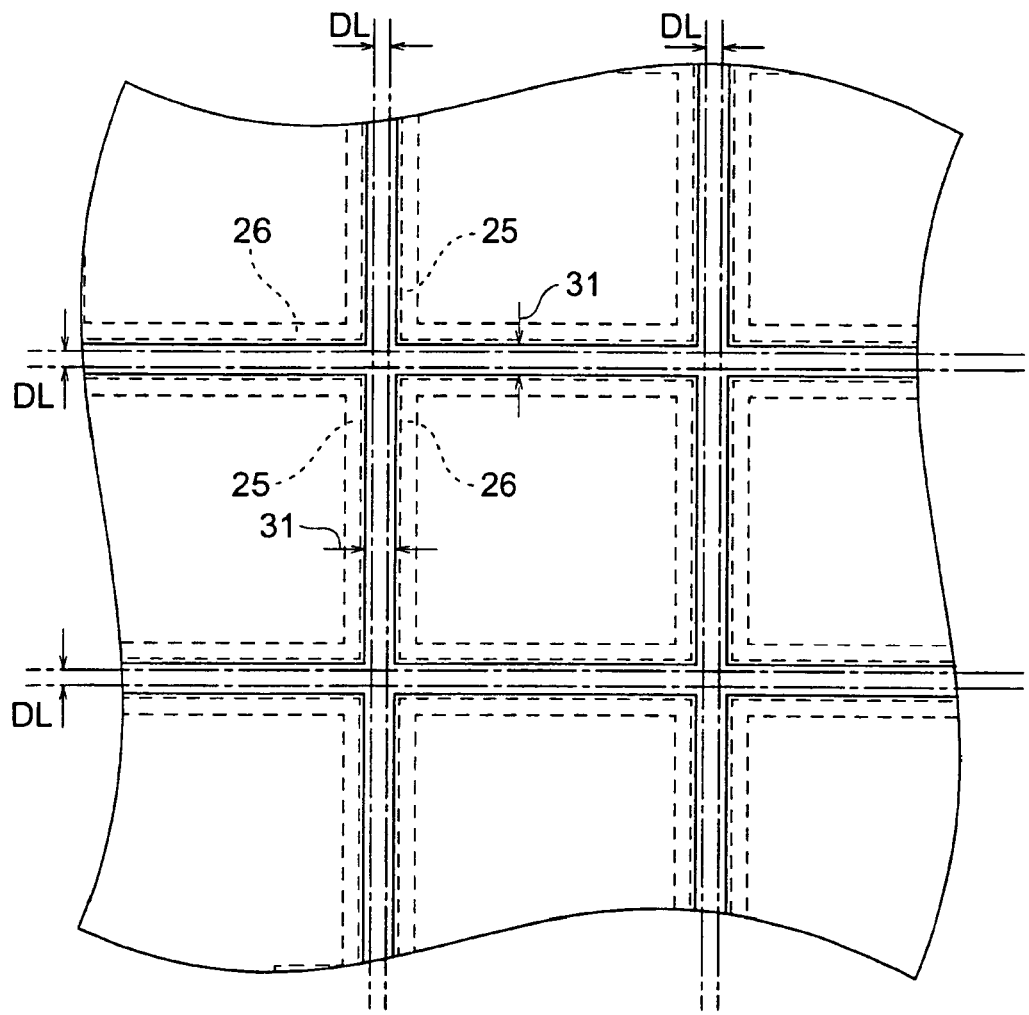
FIG. 5 is a schematic top view (another example) of a semiconductor wafer formed by the processes shown in FIG. 1A to FIG. 3B.

FIG. 5 is a schematic top view (another example) of a semiconductor wafer that is formed in the above-described manner. In FIG. 5, the same reference numerals and symbols are used to designate portions that are the same as or corresponding to those previously explained. In this example, the conductors 25, 26 and so on having the three layered structure in the substrate surface horizontal direction are formed in a ring shape on each semiconductor chip. With this structure, reliability enhancement can be expected since the progress of cracks and water permeation can be further prevented.

A structure having eleven layers of low-k insulating films was actually manufactured as a semiconductor wafer, the semiconductor wafer was diced, and semiconductor chips cut therefrom were wire-bonded for packaging. When the package was disassembled for examination, no damage such as peeling and crack of the low-k insulating films was observed even when the conductors and so on existed only at the four corners as shown in FIG. 4. No noticeable damage such as film peeling and cracks was observed either in portions, which were exposed to side faces of each of the semiconductor chips by the dicing, of the insulating film with a relative dielectric constant of over 3.8 positioned below the low-k insulating films.

A 500-hour temperature cycle test (TCT) at 150° C. was further conducted after packaging, and thereafter a 100-hour high humidity test at 100° C. and 100% RH was conducted. The package was disassembled after these tests, and no damage such as cracks and peeling was observed in the low-k insulating films and no corrosion occurred in conductors and wirings adjacent to dicing parts.

In the above explanation, the examples where the internal conductors are made of Cu and the outer side (the conductive barrier layer) thereof is made of Ta or TaN are given as the structure of the conductors 15, 21, 25 (16, 22, 26). However, the internal conductors may be made of Al or Sn and the outer side thereof may be made of Ti, Zr, W or an alloy or a chemical compound containing these metals. Further, the insulating film 28 and the passivation film 30 are films made of TEOS ($SiO_2$ film) and a SiN film respectively, but other materials appropriately selected from $SiO_2$, SiN, SiC, SiCN, and the like may be used.

Figure 6:
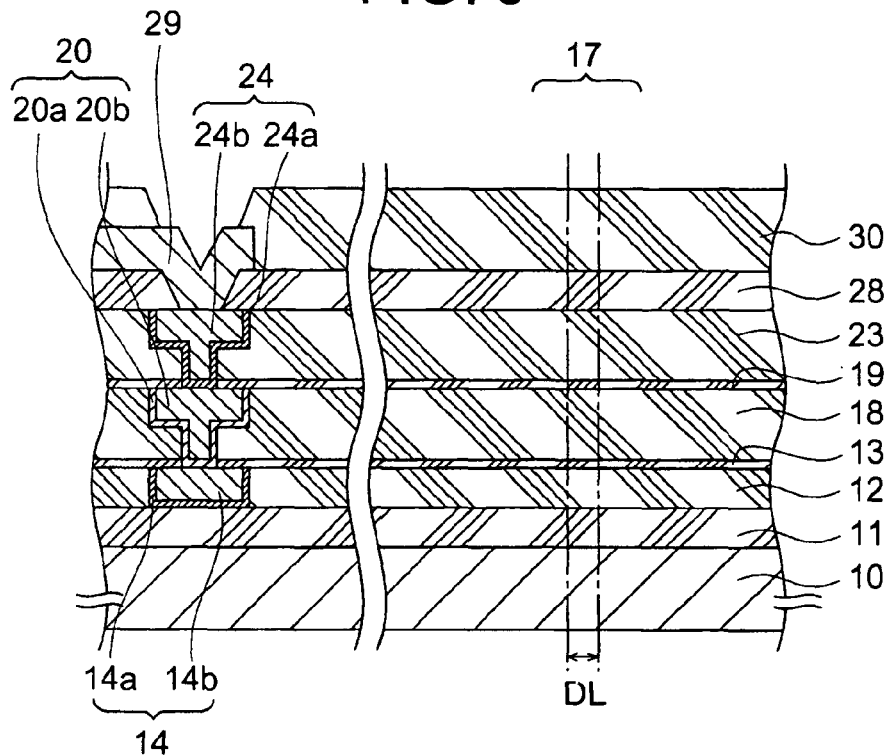
FIG. 6 is a schematic cross-sectional view showing a comparison example of the semiconductor device formed by the processes shown in FIG. 1A to FIG. 3B.

Next, comparison examples will be described. As is seen from the cross-sectional structure shown in FIG. 6, prepared was a sample in a wafer state having the structure shown in FIG. 3B excluding the trenches 31 and the conductors 15, 16, 21, 22, 25, 26. Note that the number of layers of low-k insulating films 12, 18, 23 was further increased to be eleven in total.

A wafer thus formed was cut along dicing parts and cut-out semiconductor chips were wire-bonded and packaged. When the package was disassembled for examination, peeling and cracks were observed in the low-k insulating films. Especially, the film peeling was made larger due to heat and stress that were generated when wire-bonded portions were sealed by resin, and open circuit faults were observed in part of wire-bonded pads, wirings of the upper insulating films, and so on. In such a structure without any trench for dicing, more fundamental problems than water permeation may possibly occur when the thickness of the layered insulating films and so on is large.

Figure 7:
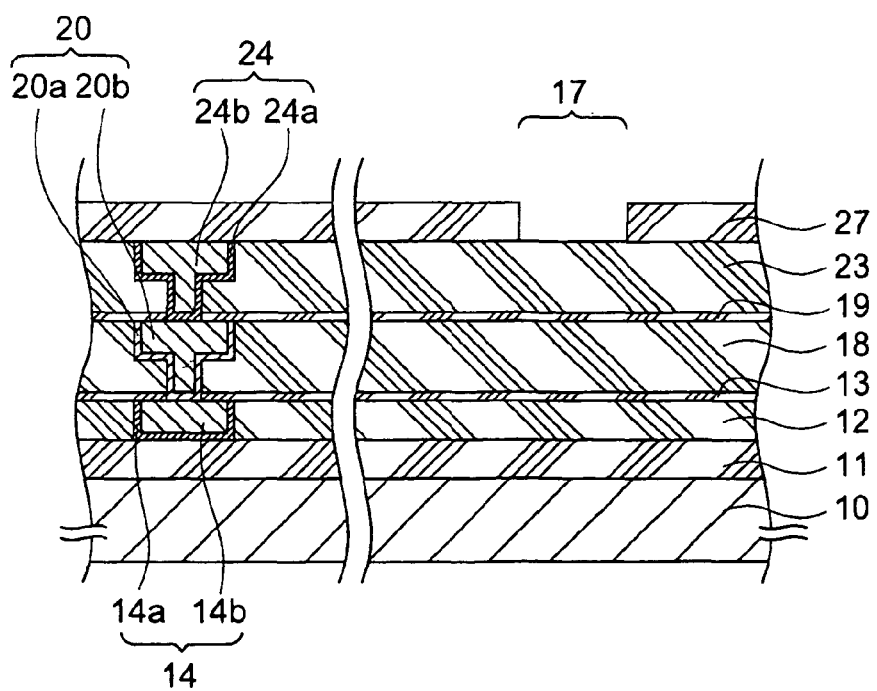
FIG. 7 is a schematic cross-sectional view showing another comparison example of the semiconductor device formed by the processes shown in FIG. 1A to FIG. 3B.

As another comparison example, prepared was a sample in which walls constituted of conductors 25, 26 and so on were not formed as in the above-described comparison example and totally eleven layers of insulating films 12, 18, 23 and so on were formed, and trenches were formed in dicing parts 17 of this sample, with the aim of forming a structure that can facilitate dicing. Specifically, the trenches were formed in the insulating films 12, 18, 23 and so on by dry etching using fluorocarbon (CF) gas, with a patterned photoresist 27 as shown in FIG. 7 used as a mask. Thereafter, the photoresist 27 was removed, and an insulating film 28 and a passivation film 30 as shown in FIG. 3B were formed. However, this sample had a problem in terms of productivity and production cost since the film thickness of eleven layers of the insulating films was 10 μm or more and it took 30 minutes to process one wafer.

Wet etching of this sample was tried, but side etching progressed to about 10 μm in a substrate surface horizontal direction from dicing parts 17, and an etched area of the insulating films greatly exceeded an area to be removed. Further, in this case, wet resistance in the vicinity of interfaces of the insulating films in the respective layers was low, and slit-shaped etching was observed in the interfaces. This is a more fundamental problem than water permeation.

Figure 8:
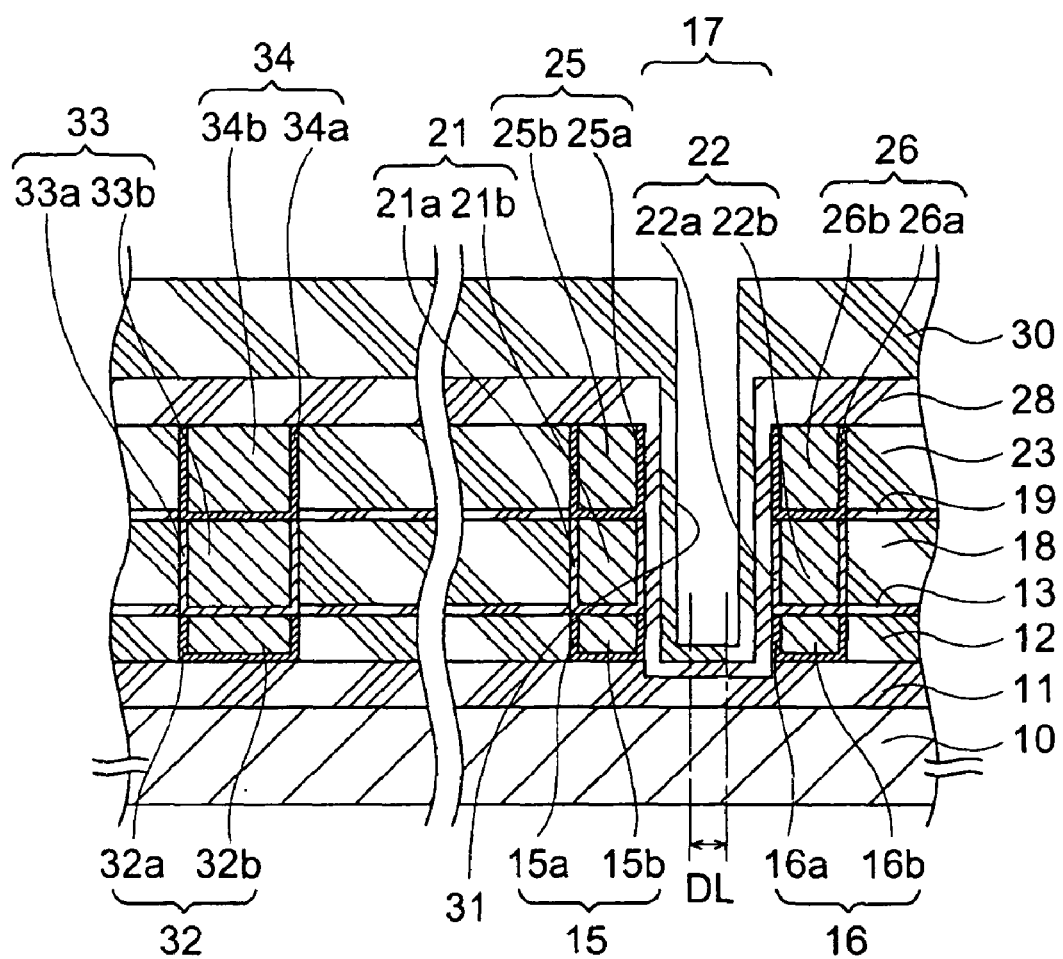
FIG. 8 is a schematic cross-sectional view showing a semiconductor device (wafer state) according to another embodiment of the present invention.

Next, a semiconductor device according to another embodiment of the present invention will be explained with reference to FIG. 8. FIG. 8 is a schematic cross-sectional view showing the semiconductor device (wafer state) according to the other embodiment of the present invention. In FIG. 8, the same reference numerals and symbols are used to designate portions that are the same as or corresponding to the portions previously explained, and explanation thereof will be omitted.

In this embodiment, so-called guard rings are provided in insulating films 12, 18, 23. The guard rings are frames of conductors provided inside interlayer insulating films near the peripheral edge of each semiconductor chip, and have a function of protecting insulating films existing further inside from water permeation. In this embodiment, via rings 32, 33, 34 as the guard rings can be formed through the same processes as the processes of forming the wirings 14, 20, 24 and the conductors 15, 21, 25 in the embodiment shown in FIG. 3A and FIG. 3B. Specifically, the via rings 32, 33, 34 are constituted of internal conductors 32b, 33b, 34b and conductive barrier layers 32a, 33a, 34a respectively, and are formed to extend in a perpendicular direction to the shown drawing so that the entire shape becomes in a ring shape.

Figure 9:
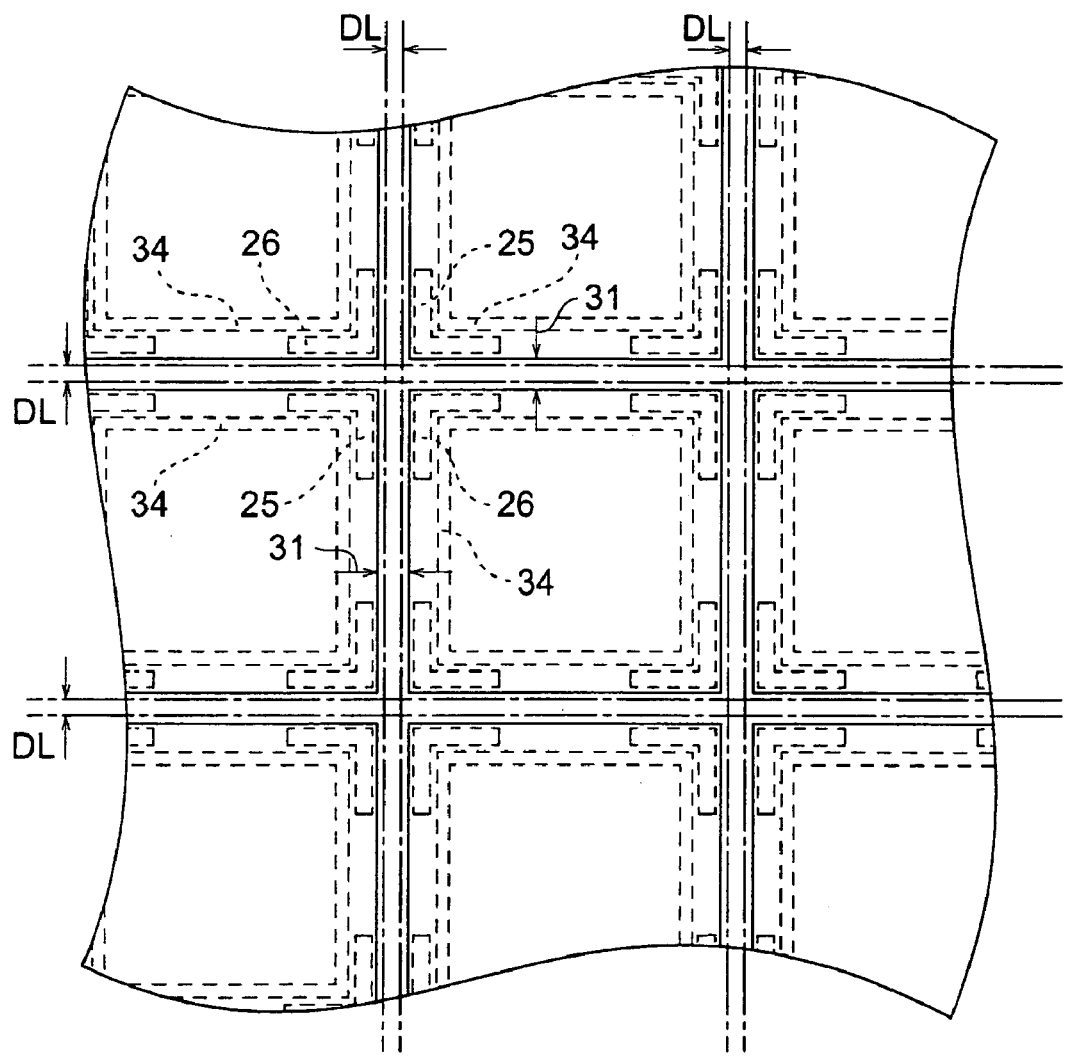
FIG. 9 is a schematic top view of the semiconductor device shown in FIG. 8.

FIG. 9 is a schematic top view of the semiconductor wafer formed as shown in FIG. 8. In FIG. 9, the same reference numerals and symbols are used to designate portions that are the same as or corresponding to the portions previously explained. In this example, in a case where conductors 25 (26) and so on are provided only at four corners of each semiconductor chip, the via rings 34 (32, 33) are provided further inside as the guard rings. With such a structure, the via rings 34 (32, 33) further enhance an effect of preventing water permeation thereinto. Incidentally, when a plurality of guard rings are formed in a frame shape, this effect can be further enhanced.

Next, a manufacturing method of a semiconductor device according to still another embodiment of the present invention will be explained with reference to FIG. 10A to FIG. 12B. FIG. 10A to FIG. 12B are schematic cross-sectional views showing processes of the manufacturing method of the semiconductor device according to the still another embodiment of the present invention. These drawings are sequential views in the order of the drawing number, and the processes progress in the order of A to B in each of the drawings in FIG. 10A to FIG. 12B. In these drawings, the same reference numerals and symbols are used to designate portions that are the same as or corresponding to the portions previously explained, and explanation thereof will be omitted.

Figure 10A:
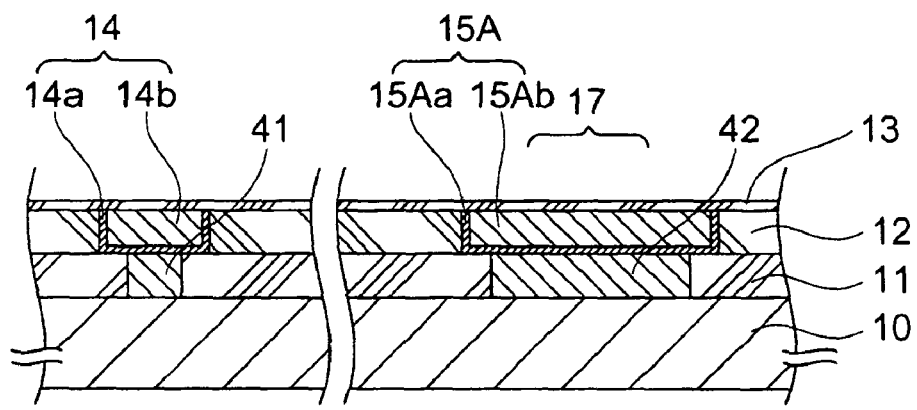
FIG. 10A and FIG. 10B are schematic cross-sectional views showing processes of a manufacturing method of a semiconductor device according to still another embodiment of the present invention.

First, the structure shown in FIG. 10A is formed. This structure is different from the structure shown in FIG. 1A in that corrosion resistant conductors 41, 42 are formed in part of areas of an insulating film 11, and conductors 15A each constituted of an internal conductor 15Ab and a conductor barrier layer 15Aa are formed to embrace dicing parts 17. The conductors 15A, the internal conductors 15Ab, and the conductive barrier layers 15Aa are made of the same materials as the materials of those denoted by corresponding reference symbols without A in the structure shown in FIG. 1A. Hereinafter, those denoted by reference symbols including "A" used in FIG. 10B also have the same relationship with those denoted by corresponding reference symbols without "A" in the structure shown in FIG. 1B.

The corrosion resistant conductors 41 are conductors for realizing contact with elements (not shown) such as transistors formed on a semiconductor substrate 10. The conductors 41 can be formed, using a known method. Specifically, for example, such a method is used in which contact holes are formed in the insulating film 11, conductive barrier layers made of, for example, TiN are formed in the formed contact holes by, for example, a PVD method, and W films are further formed by a CVD (chemical vapor deposition) method to be buried in the contact holes.

Occupying areas of the corrosion resistant conductors 42 are set to be at positions substantially below bottom faces of the conductors 15A, and the corrosion resistant conductors 42 can be formed at the same time with the above-described conductors 41 by the same method as that of the conductors 41. Note that the corrosion resistant conductors 42 may be larger in width than the conductors 15A.

Figure 10B:
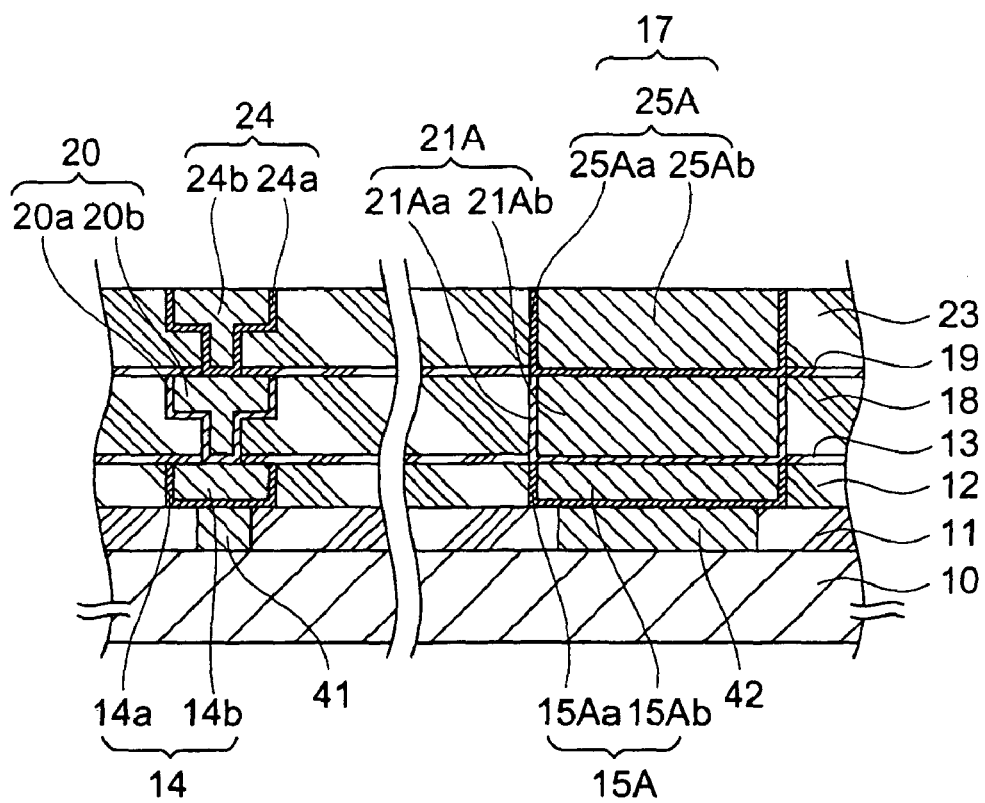

Next, the structure shown in FIG. 10B is formed. This structure is different from the structure shown in FIG. 1B in that conductors 21A each constituted of an internal conductor 21Ab and a conductive barrier layer 21Aa are formed at positions overlapping the conductors 15A formed to embrace the dicing parts 17. Another difference is that conductors 25A each constituted of an internal conductor 25Ab and a conductive barrier layer 25Aa are formed to overlap the conductors 21A. In this embodiment, in addition to forming three layers of low-k films (insulating films 12, 18, 23), it is also possible to increase the number of layers of the insulating films in the same manner.

Figure 11A:
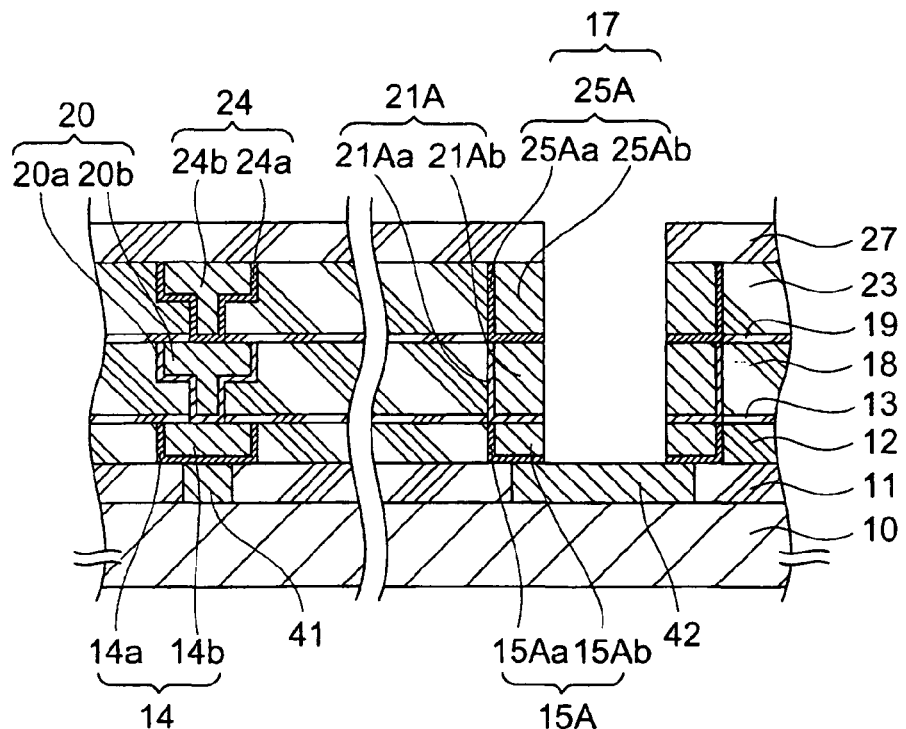
FIG. 11A and FIG. 11B, which are views subsequent to FIG. 10B, are schematic cross-sectional views showing processes of the manufacturing method of the semiconductor device according to the above-mentioned still another embodiment of the present invention.

Next, the dicing parts 17 are processed to form trenches as shown in FIG. 11A. Specifically, a photoresist 27 formed on the insulating film 23 is first patterned by a photolithography method so as to have openings only at portions above the dicing parts 17. Then, etching using a mixed wet solution of, for example, $H_2O_2$ and HCl for removing the internal conductors 25Ab, 21Ab, 15Ab (copper) and dry etching using a Cl-based gas for removing the conductive barrier layers 25Aa, 21Aa, 15Aa are alternately conducted. Through these processes, trenches reaching the corrosion resistant conductors 42 are formed as shown in the drawing. Incidentally, here in etching the conductors 25A, 21A, 15A, the use of high selection ratio conditions to the corrosion resistant conductors 42 makes it possible to utilize the corrosion resistant conductors 42 as etching stoppers.

Figure 11B:
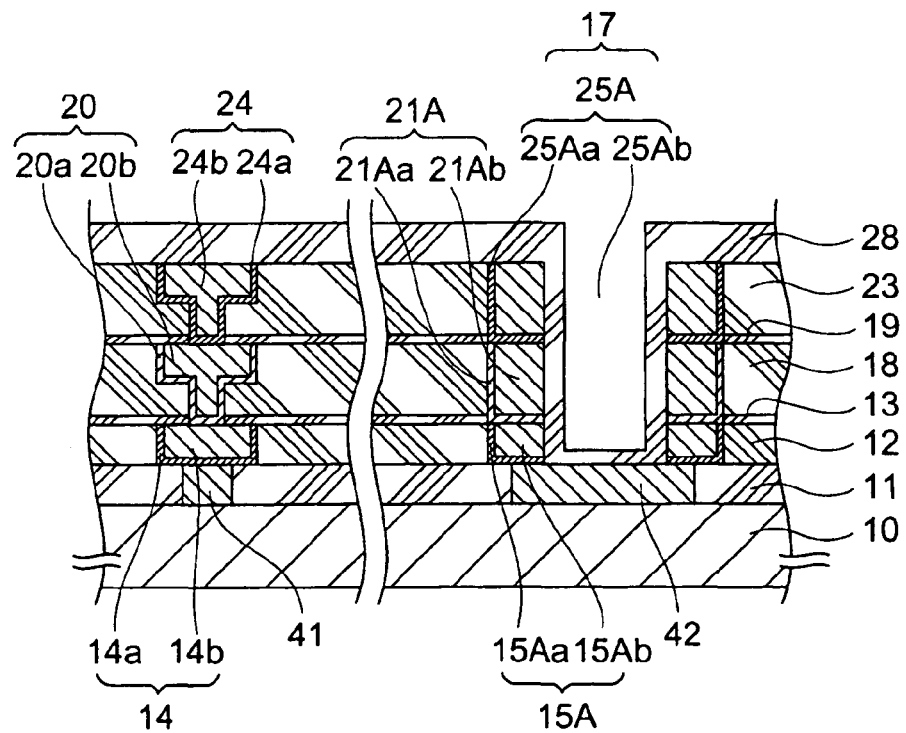
Figure 12A:
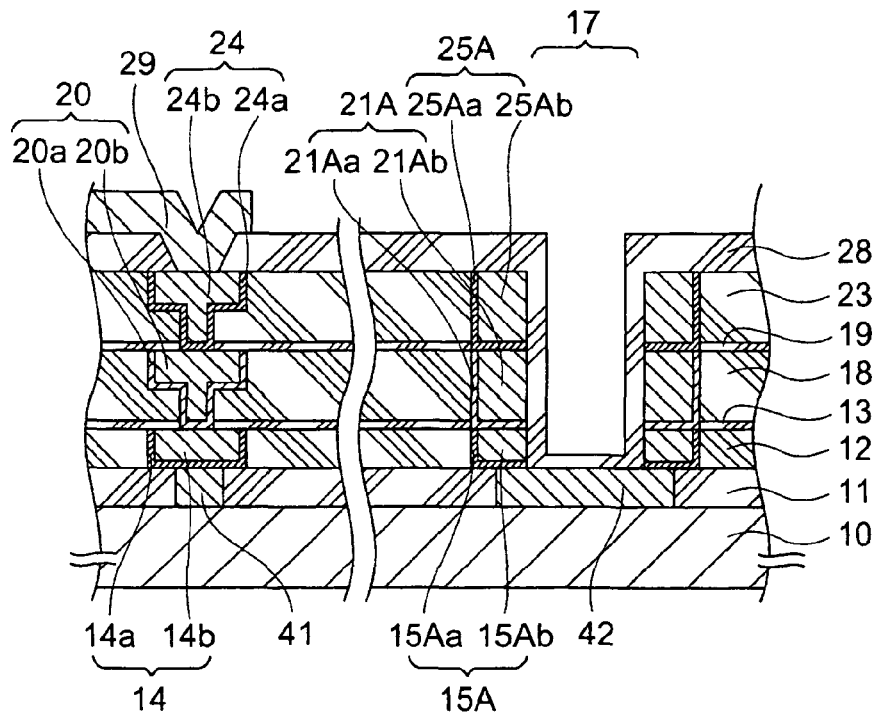
FIG. 12A and FIG. 12B, which are views subsequent to FIG. 11B, are schematic cross-sectional views showing processes of the manufacturing method of the semiconductor device according to the above-mentioned still another embodiment of the present invention.
Figure 12B:
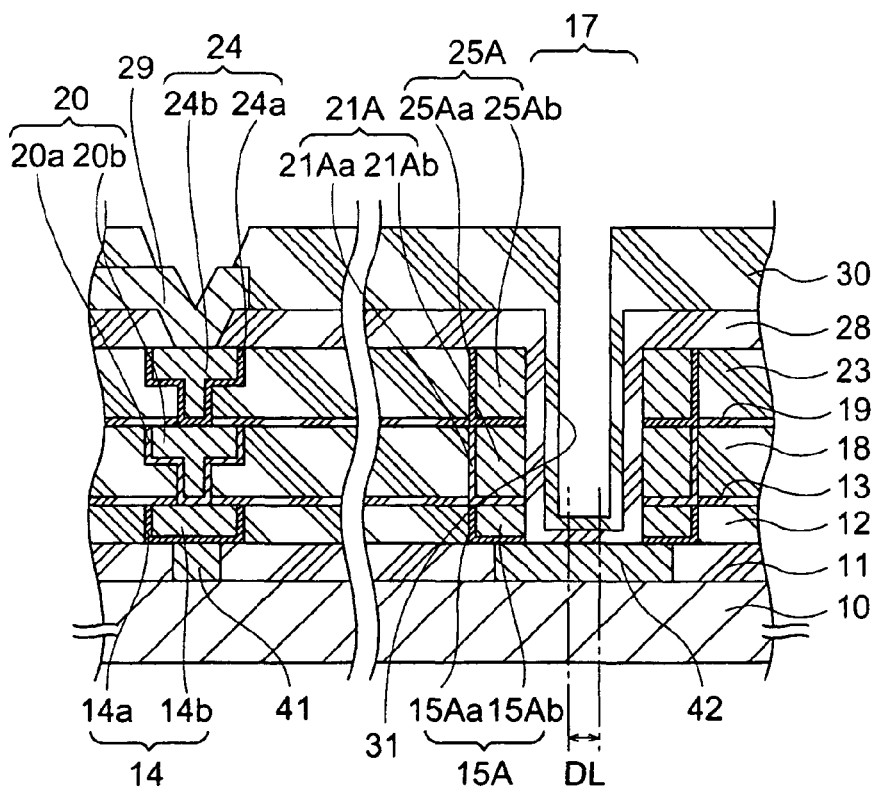

FIG. 11B, FIG. 12A, and FIG. 12B shown next are substantially the same as FIG. 2B, FIG. 3A, and FIG. 3B that are previously explained, respectively.

In this embodiment, the trenches 31 are formed in the dicing parts 17 in advance and walls constituted of the conductors 25A and so on are formed on both sides of each of the dicing parts 17 at least at four corners of each chip. This also makes it possible to prevent cracks at the time of dicing that are likely to occur in the insulating films 12, 18, 23 with k=3.8 or less. Especially, even when cracks occur in a passivation film 30, the walls constituted of the conductors 25A and so on that are harder than the insulating films 12, 18, 23 can prevent the progress of the cracks from reaching multilayered wirings 24, 20, 14.

Further, the existence of the corrosion resistant conductors 42 extending from directly under an insulating film 28 and the passivation film 30, which serve as the second insulating film, to directly under the conductors 15A brings about another effect. Specifically, in the state of cut-out chips, the corrosion resistant conductors 42 exist at least near four corners of each chip, being exposed between the insulating film 28 and the substrate 10. Therefore, since the corrosion resistant conductors 42 themselves have corrosion resistance, and the exposure of side faces of the insulating film 11 is prevented at least near four corners of each chip directly under the low-k insulating films 12, 18, 23, reliability is further improved. Incidentally, even in a case where part of the sidewalls of the insulating film 11 is exposed at a portion other than the four corners of the semiconductor chip or other than a portion directly under the low-k insulating films 12, 18, 23, for example, exposed under the corrosion resistant conductors 42, the formation of the corrosion resistant conductors 42 accordingly improves corrosion resistance, resulting in improved reliability.

Further, a semiconductor wafer thus manufactured also has the trenches 31 formed in the dicing parts 17 and the dicing lines DL existing inside the trenches 31 as shown in FIG. 12B. Therefore, the dicing process is facilitated. For comparison, a sample was prepared as a semiconductor wafer, in which the number of layers of the low-k insulating films 12, 18, 23 were further increased to form an eleven layered structure, and etching of the conductors 25A and so on shown in FIG. 11A was not conducted and thus no trench 31 was formed. Copper adhered to a dicing blade at the time of dicing this sample to prevent normal dicing.

Further, in the embodiment shown in FIG. 10A to FIG. 12B, in a state of cut-out chips, the low-k insulating films 12, 18, 23 as the first insulating film are covered with the conductors 15A, 21A, 25A at least near four corners of each semiconductor chip, and further covered with the insulating film 28 and a passivation film 30 as the second insulating film. Consequently, the low dielectric constant insulating films 12, 18, 23 are protected and reliability is also enhanced.

A structure having eleven layers of low-k insulating films was actually manufactured as a semiconductor wafer, the semiconductor wafer was diced, and semiconductor chips cut from the semiconductor wafer were wire-bonded and packaged. When the package was disassembled for examination, no damage such as peeling and cracks was observed in the low-k insulating films even when conductors exist only at four corners as shown in FIG. 4. Neither, observed was any noticeable damage such as peeling and cracks in an insulating film having a relative dielectric constant of over 3.8 positioned under the low-k insulating films.

In this embodiment, there can be also some cases where the conductors 25A and so on are formed in the ring shape as shown in FIG. 5 instead of providing the conductors 25A and so on only near four corners as shown in FIG. 4. In both cases, the corrosion resistant conductors 42 can be formed so as to be disposed in a ring shape. Further, via rings 34 and so on may be additionally provided as shown in FIG. 9 to enhance the effect of preventing water permeation.

The internal conductors 15Ab, 21Ab, 25Ab may be made of Al, Sn, or the like instead of Cu. Note that the use of tungsten, which itself has corrosion resistance similarly to the corrosion resistant conductors 42, for the internal conductors 15Ab, 21Ab, 25Ab would be disadvantageous in terms of productivity since tungsten is difficult to dry-etch and wet-etch compared with copper.

Figure 13:
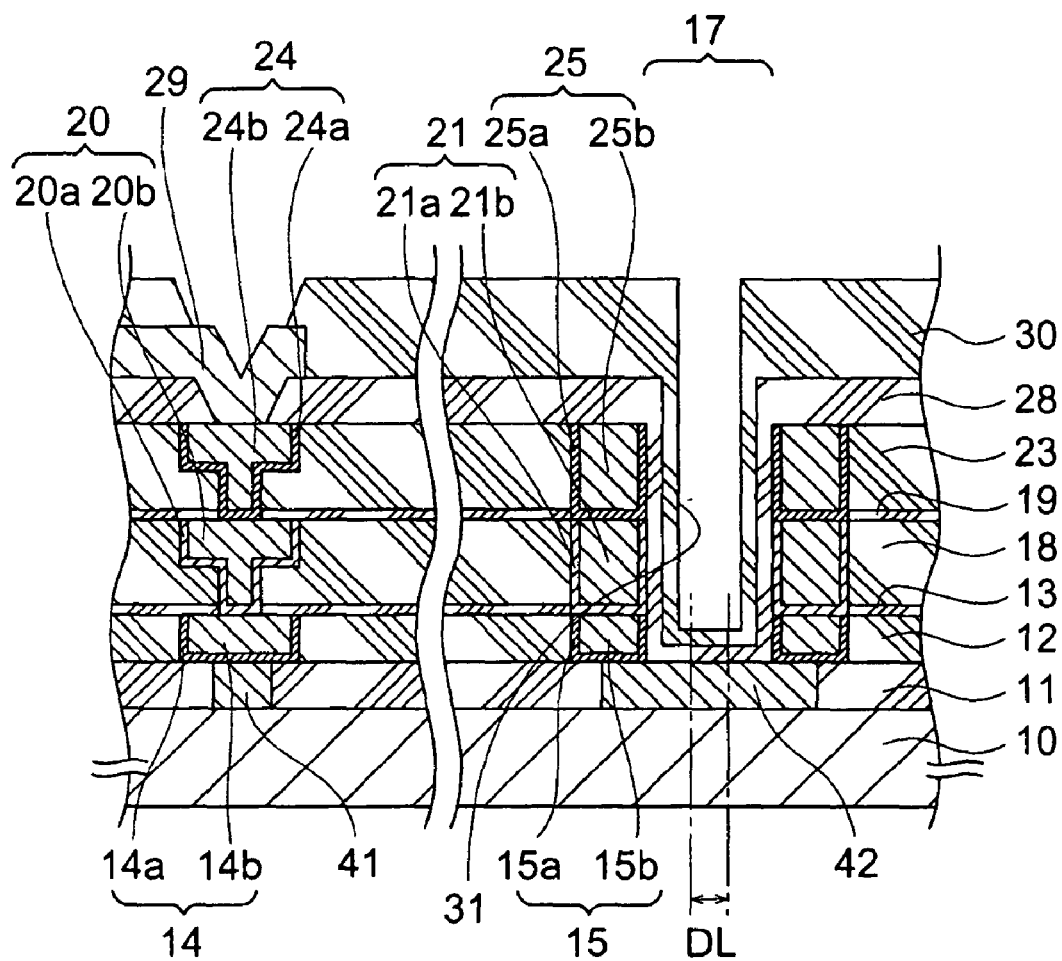
FIG. 13 is a schematic cross-sectional view showing a semiconductor device (wafer state) according to yet another embodiment of the present invention.

Next, a semiconductor device according to yet another embodiment of the present invention will be explained with reference to FIG. 13. FIG. 13 is a schematic cross-sectional view showing the semiconductor device (wafer state) according to the yet another embodiment of the present invention. In FIG. 13, the same reference numerals and symbols are used to designate portions that are the same as or corresponding to those explained previously, and explanation thereof will be omitted.

This embodiment has a structure such that the corrosion resistant conductors 41, 42 in the embodiment shown in FIG. 10A to FIG. 12B are added to the embodiment explained with reference of FIG. 1A to FIG. 3B. Therefore, the respective effects are combined. Moreover, it is also possible to utilize the corrosion resistant conductors 42 as etching stoppers when the insulating films 23, 18, 12 in the dicing parts 17 are removed by etching with a wet solution. Also in this case, the via rings 34 and so on may be additionally provided as shown in FIG. 9 to enhance the effect of preventing water permeation.

The present invention is not to be limited to the specific forms described with the illustrations here, and it should be understood that all changes which come within the meaning and range of equivalency of the following claims are intended to be embraced therein.

What is claimed is:

1. A semiconductor device comprising:
    a semiconductor substrate;
    a first insulating film formed above the semiconductor substrate and having a relative dielectric constant of 3.8 or less;
    a conductor provided outside the first insulating film and covering an outer side face of the first insulating film at least near four corners of the semiconductor substrate, the conductor including a conductive barrier layer on at least an outer side face thereof; and
    a second insulating film provided on the first insulating film and on an outer side face of the conductor, the second insulating film covering the outer side face of the conductor and having a relative dielectric constant of over 3.8,
    wherein the first insulating film and the second insulating film are positioned so as to directly sandwich the conductor at least at a first horizontal level above the semiconductor substrate and also at a second horizontal level higher than the first horizontal level above the semiconductor substrate.

2. A semiconductor device as set forth in claim 1, wherein the conductive barrier layer contains one kind selected from a group consisting of titanium (Ti), tantalum (Ta), zirconium (Zr), and tungsten (W), and the conductor contains as a major component one kind selected from a group consisting of copper (Cu), aluminum (Al), and tin (Sn).

3. A semiconductor device as set forth in claim 1,
    wherein the second insulating film is extended so as to cover an upper side of the first insulating film, the semiconductor device further comprising
    a conductor pattern passing through the second insulating film positioned on the upper side of the first insulating film.

4. A semiconductor device as set forth in claim 3, further comprising a conductive pattern buried in the first insulating film.

5. A semiconductor device as set forth in claim 1, wherein the first insulating film is constituted of a plurality of layers.

6. A semiconductor device as set forth in claim 1, wherein the conductor is formed in a ring shape covering an entire side face of the first insulating film.

7. A semiconductor device as set forth in claim 1, wherein the second insulating film is at least one kind selected from a group consisting of silicon oxide ($SiO_2$), silicon nitride (SiN), silicon carbide (SiC), and silicon carbonitride (SiCN).

* * * * *